Oct. 27, 1970 UDO LOB ET AL 3,536,964

SEMICONDUCTOR DEVICE SEALED GAS-TIGHT BY THIXOTROPIC MATERIAL

Filed July 13, 1967 2 Sheets-Sheet 1

United States Patent Office 3,536,964

Patented Oct. 27, 1970

3,536,964

SEMICONDUCTOR DEVICE SEALED GAS-TIGHT BY THIXOTROPIC MATERIAL

Udo Lob, Munich, and Hans-Jürgen Nixdorf, Berlin-Lankwitz, Germany, assignors to Siemens Aktiengesellschaft, Berlin and Munich, Germany, a corporation of Germany Filed July 13, 1967, Ser. No. 653,096
Claims priority, application Germany, July 18, 1966, S 104,850
Int. Cl. H01l 3/00, 5/00
U.S. Cl. 317—234 11 Claims

ABSTRACT OF THE DISCLOSURE

A semiconductor component is sealed in a housing by an intermediate portion of thixotropic fusible synthetic material which fills the gap formed between an under housing member and an over housing member in a gas-tight manner. The under housing member supports the semiconductor component and the over housing member covers the semiconductor component.

The present invention relates to a sealed semiconductor device. More particularly, the invention relates to gas-tight sealed semiconductor device.

The semiconductor device of the present invention comprises a semiconductor component enclosed in a metal housing. The housing comprises an under housing member and an over housing member joined or sealed by an intermediate electrically insulating portion. The semiconductor component may comprise any suitable semiconductor body, controllable or non-controllable, which may comprise any suitable semiconductor material such as, for example, silicon, germanium, or an intermetallic compound such as, for example, an $A_{III}$ $B_V$ compound. The semiconductor body has at least one p-n junction.

The semiconductor body may be positioned directly between the under and over housing members, or it may be positioned between a pair of metal terminals or electrode members which may be soldered or otherwise affixed to said semiconductor body, or which may merely clamp said semiconductor body between them without being affixed thereto. The terminals or electrode members are in turn covered by the under and over housing members which are covered by pressure members, which clamp the semiconductor body and its electrode members and the housing between them and which function as cooling bodies. The semiconductor device is thereby provided with good heat and current conductivity between the semiconductor body and the pressure members.

The sealing of the semiconductor component into the housing involves considerable difficulty and expense, as well as special, rather complex equipment. In sealing the semiconductor component into the housing, the under and over housing members were soldered and affixed to an insulating ring of ceramic material with metal parts welded thereto. A gas-tight or air-tight seal has been attempted by the utilization of a liquified synthetic material which is subsequently hardened. This involved several difficulties. A principal difficulty is the flowing off of the liquified synthetic material. The prevention of flow off of the liquified synthetic material requires shapes, configurations, forms, molds, or the like, which must be sealed against the outside areas of the housing members, since such outside areas must be maintained free from the synthetic material. The provision of such configurations, molds, or the like entails considerable difficulty and expense. Further difficulty and expense are entailed in the requirement that the synthetic material be prevented from flowing between the electrode members and the inside areas of the housing members, since seals inside the housing are utilized to prevent such flow.

The principal object of the present invention is to provide a new and improved gas-tight sealed semiconductor device. The semiconductor device of the present invention avoids the difficulties of the prior art semiconductor devices. The semiconductor device of the present invention is sealed in a gas-tight manner by synthetic material without difficulty or great expense and without the need for special equipment or components. The semiconductor device of the present invention is of simple structure and provides a gas-tight seal with efficiency, effectiveness and reliability.

In accordance with the present invention, thixotropic fusible synthetic material is utilized as the intermediate electrically insulating portion to join or seal the under and over housing members.

In accordance with the present invention, a gas-tight sealed semiconductor device comprises a semiconductor component and a housing enclosing the semiconductor component. The housing comprises an under housing member supporting the semiconductor component and an over housing member covering the semiconductor component. The under and over housing members are in spaced relation in a manner whereby they form a gap between them. An intermediate portion fills the gap in a gas-tight manner. The intermediate portion comprises thixotropic fusible synthetic material. Each of the under and over housing members preferably comprises metal and each of the under and over housing members preferably comprises thin pliable sheets of tin-plated copper. The intermediate portion material is electrically insulative. An elastic jacket of electrically insulative material is provided around the semiconductor component and transverse to the under and over housing members.

In one embodiment of the semiconductor device of the present invention, the under housing member has a configuration of a substantially shallow pan having a closed base under the semiconductor components and an open base around the semiconductor component and the semiconductor protrudes from the open base of the under housing member. The over housing member may have a substantially cylindrical configuration having a closed base over the semiconductor component and an open base around the semiconductor component and extending within the open base of the under housing member. The gap is formed between the under and over housing members in the area of the open bases thereof. The under housing member further comprises an annular flange extending around the open base thereof and the intermediate portion material is supported on the annular flange and extends within the gap.

In another embodiment of the present invention, the intermediate portion material is supported on the closed base of the under housing member within the under housing member and extends within the gap.

In another embodiment of the present invention, the over housing member has a configuration of a substantially shallow pan having a closed base over the semiconductor component and an open base around the semiconductor component and spaced from the open base of the under housing member. The semiconductor member protrudes from the open base of the over housing portion. Each of the under and over housing members has an annular flange extending around the open base thereof. The flanges are spaced from each other and form the gap between them and the intermediate portion material is provided between the annular flanges and fills the space between them.

In another embodiment of the present invention, each of the under and over housing members has a substantially cylindrical configuration. The under housing member has a closed base under the semiconductor component and an open base around the semiconductor component and the over housing member has a closed base over the semiconductor component and an open base around the semiconductor component. The gap is formed between the under and over housing members in the area of the open bases thereof. The under housing member has a large diameter and a small altitude relative to the over housing member and the over housing member has a small diameter and a large altitude relative to the under housing member. The open base of the over housing member extends within the open base of the under housing member and the intermediate portion material is supported on the closed base of the under housing member within the under housing member and extending within the gap.

In another embodiment of the present invention, each of the under and over housing members has the same diameter and altitude and the open base of each is spaced from the open base of the other. The semiconductor component protrudes from the open base of each of the under and over housing members. The closed bases of the under and over housing members are spaced from each other and form the gap between them. The intermediate portion material is provided between the closed bases and fills the space between them.

In still another embodiment of the present invention, each of the under and over housing members is of substantially, planar plate configuration. The under and over housing members are spaced from each other and form the gap between them. The intermediate portion material is provided between the under and over housing members and fills the space between them.

In accordance with the present invention, a method of producing a gas-tight sealed semiconductor device comprises the steps of placing a semiconductor component on an under housing member in an evacuated chamber; placing an over housing member over the semiconductor component in the evacuated chamber in spaced relation with the under housing member to form a gap between them; placing an intermediate portion of thixotropic fusible synthetic material closely adjacent the gap; heating the under and over housing members to the melting point of the synthetic material; and decreasing the temperature in the chamber to permit hardening of the synthetic material. Instead of being evacuated, the chamber may be gas-tight and filled with a gas.

In order that the present invention may be readily carried into effect, it will now be described with reference to the accompanying drawings, wherein.

In the figures, the same components are identified by the same reference numerals.

A thixotropic material gels or solidifies upon standing and liquifies upon agitation. The change of state is, at least to some extent, reversible. Thixotropic materials include clay suspensions, highly pigmented pastes, certain paints and certain synthetic materials. A synthetic material which is particularly suitable for the purposes of the present invention is Araldite E Form Series 1700, produced by CIBA of Basel, Switzerland. "Polymers and Resins, Their Chemistry and Chemical Engineering" by Brage Golding, 1959, D. Van Nostrand Company, Inc., Princeton, N.J., page 571 and 355. A thixotropic material thus cannot be made to flow or to wet another body without an additional outside force in addition to agitation by heat.

The Araldite, which is utilized as the intermediate portion, is substantially solid at room temperature. It may thus be preformed into rings having dimensions which are such that after assembly of the semiconductor component a ring may be tightly positioned on the desried surface or surfaces of the housing. When the semiconductor device, which includes the housing and the intermediate portion of Araldite, is heated, the Araldite or other suitable thixotropic synthetic material flows only to the desired contact areas and thoroughly wets such contact areas. There is no need for preventing the flow off of the synthetic material, since there is none, and no special equipment or components are required for such purpose.

Figure 1:
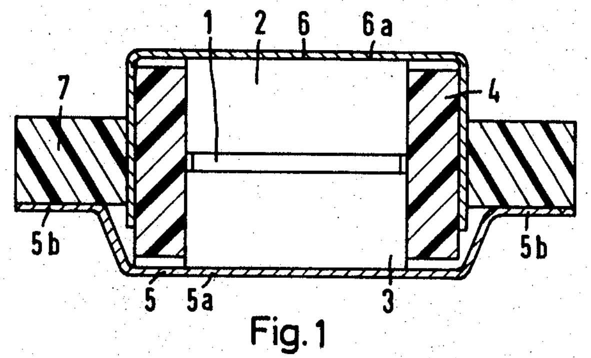
FIG. 1 is a view, partly in section, of a first embodiment of the semiconductor device of the present invention, prior to heating.

In FIG. 1, the semiconductor component comprises a semiconductor body 1 having at least one p-n junction therein and electrodes at its surfaces. An electrical terminal body or electrode member 2 is positioned on one surface of the semiconductor body 1 and an electrical terminal body or electrode member 3 is positioned on the other surface of said semiconductor body. Each of the electrode members 2 and 3 comprises a porous, sintered metal such as, for example, copper having a density of about 90%. The semiconductor body 1 and the electrode members 2 and 3 together constitute the semiconductor component.

An elastic jacket 4 of electrically insulating synthetic material such as, for example, silicon, is placed around the semiconductor component 1, 2, 3. The elastic jacket 4 is positioned transverse to the under and over housing members, hereinafter described. The semiconductor component 1, 2, 3 is thus held together as a unit by the elastic jacket 4.

The semiconductor component 1, 2, 3, 4 is positioned on the closed base **5*a* or inside bottom surface of an under housing member 5 of substantially shallow pan configuration having a closed base 5*a* under said semiconductor component and an open base around said semiconductor component. The semiconductor component 1, 2, 3, 4 protrudes from the open base of the under housing member 5. An annular flange 5*b* extends radially outward around the open base of the under housing member 5**.

An over housing member 6 is positioned over the semiconductor component 1, 2, 3, 4. The over housing member 6 is of substantially cylindrical configuration having a closed base **6*a* over the semiconductor component 1, 2, 3, 4 and an open base around said semiconductor component and extending within the open base of the under housing member 5. The over housing member 6 fits over and around the elastic jacket 4 of the semiconductor component 1, 2, 3, 4. The inside bottom surface or closed base 6*a* of the over housing member 6 abuts the upper end surface of the semiconductor component 1, 2, 3, 4**.

An intermediate portion 7 of thixotropic fusible synthetic material of substantially annular configuration is placed around the over housing member 6 and on the flange **5*b* of the under housing member 5. Each of the under and over housing members 5 and 6** comprises a metal, and preferably comprises a thin, pliable sheet of tin-plated copper.

Figure 2:
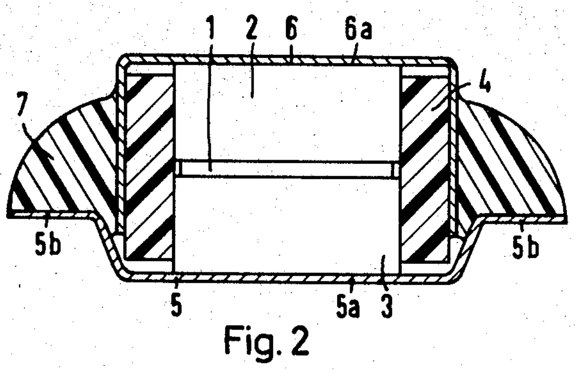
FIG. 2 is a view, partly in section, of the embodiment of FIG. 1 subsequent to heating.

As shown in the figures, the under housing member 5 and the over housing member 6 are positioned in spaced relation to each other in a manner whereby they form a gap between them. In the preheated condition of the semiconductor device, the thixotropic material 7 covers the gap between the under and over housing members 5 and 6, respectively. The thixotropic material 7 is preferably Araldite, as hereinbefore described and is electrically insulative. The gap in FIGS. 1 and 2 is formed between the under and over housing members 5 and 6, respectively, in the area of the open bases thereof.

FIG. 1 shows the first embodiment of the semiconductor device of the present invention before heating. When the components of FIG. 1 are heated, in an evacuated or gas-filled or air-filled gas-tight chamber, to 120° C., for example, the thixotropic synthetic material 7 melts. Since it is thixotropic, the synthetic material, as shown in FIG. 2, flows only to its contact areas with the under and over housing members 5 and 6, respectively. Since the thixotropic synthetic material 7 is then influenced by capillary forces, there is good wetting between said synthetic material and the under and over housing members 5 and 6 at the contact areas of said synthetic material and said housing members. The effect of gravity is to alter the shape of the intermediate portion synthetic material 7, as shown in FIG. 2, but there is no flow off. The thixotropic material 7 is then permitted to harden, so that it remains in the shape shown in FIG. 2.

Figure 3:
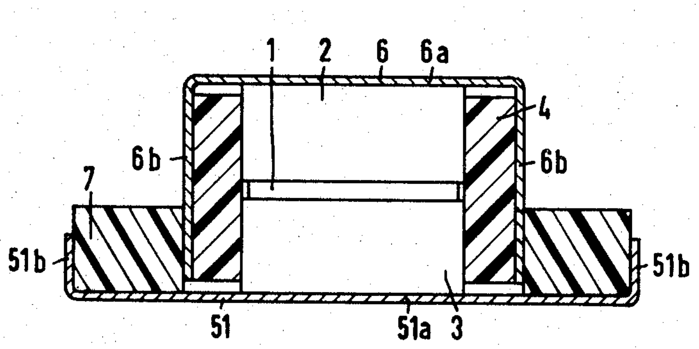
FIG. 3 is a view, partly in section, of a second embodiment of the semiconductor device of the present invention, prior to heating.

In another embodiment of the semiconductor device of the present invention, as shown in FIG. 3, each of the under housing member 51 and the over housing member 6 is of substantially cylindrical configuration. The under housing member 51 has a closed base 51*a* under the semiconductor component 1, 2, 3, 4 and an open base around said semiconductor component. The over housing member 6 is the same as that in the embodiment of FIG. 1. The closed base 51*a* of the under housing member 51 is under the semiconductor component 1, 2, 3, 4 and the closed base 6*a* of the over housing member 6 is over said semiconductor component. The open base of the under housing member 51 is around the semiconductor component 1, 2, 3, 4 and the open base of the over housing member 6 is around said semiconductor component.

The under housing member 51 of the embodiment of FIG. 3 has a large diameter and a small altitude relative to the over housing member 6 and said over housing member has a small diameter and a large altitude relative to said under housing member. The open base of the over housing member 6 extends within the open base of the under housing member 51. The gap is formed between the under and over housing members 51 and 6 in the area of the open bases thereof.

The intermediate portion material 7, which is initially in substantially annular form, is supported on the closed base 51*a* of the under housing member 51 and extends within said under housing member and within the gap to fill the annular space formed between the cylindrical sides 6*b* of the over housing member 6 and the cylindrical sides 51*b* of said under housing member by the difference in diameter of said under and over housing members. The cylindrical sides 51*b* of the under housing member 51 provide a larger adhering or contact surface between the thixotropic fusible synthetic material of the intermediate portion 7 and said under housing member.

Figure 4:
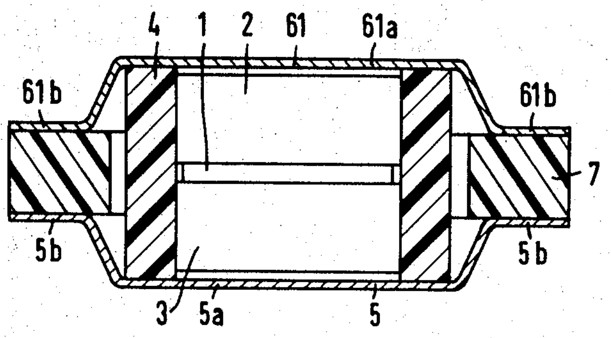
FIG. 4 is a view, partly in section, of a third embodiment of the semiconductor device of the present invention, prior to heating.

In the embodiment of FIG. 4, the over housing member 61 is the same as the under housing member 5 of the embdoiments of FIGS. 1 and 4. Thus, the under housing 5 is of substantially shallow pan configuration having a closed base 5*a* under the semiconductor component 1, 2, 3, 4 and an open base around said semiconductor component. The semiconductor component 1, 2, 3, 4 protrudes from the open base of the under housing member 5. An annular flange 5*b* extends radially outward around the open base of the under housing member 5.

The over housing member 61 is of substantially shallow pan configuration having a closed base 61*a* over the semiconductor component 1, 2, 3, 4 and an open base around said semiconductor component and spaced from the open base of the under housing member 5. The semiconductor component 1, 2, 3, 4 protrudes from the open base of the over housing member 61. An annular flange 61*b* extends radially outward around the open base of the over housing member 61.

The flanges 5*b* and 61*b* of the identical under and over housing members 5 and 61, respectively, are spaced from each other and form an annular gap between them. The thixotropic fusible synthetic material of the intermediate portion 7, which is initially in substantially annular form, is provided between the annular flanges 5*b* and 61*b* and fills the space betwen them.

Figure 5:
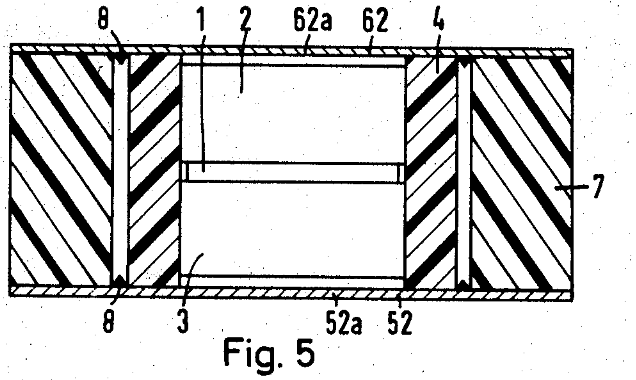
FIG. 5 is a view, partly in section, of a fourth embodiment of the semiconductor device of the present invention, prior to heating.
Figure 6:
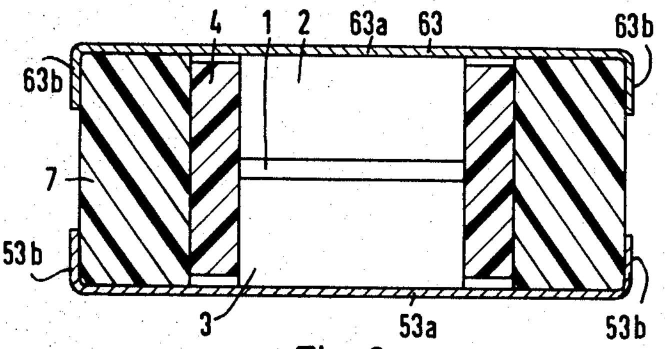
FIG. 6 is a view, partly in section, of a fifth embodiment of the semiconductor device of the present invention, prior to heating.

The altitude of the substantially annular elastic jacket 4 is less than the axial length of the semiconductor component 1, 2, 3 in the embodiments of FIGS. 1, 3 and 6, so that in each of these embodiments the under housing member abuts the electrode member or terminal 3 and the over housing member abuts the electrode member or terminal 2 of said semiconductor component. In the embodiments of FIGS. 4 and 5, however, the altitude of the substantially annular elastic jacket 4 is greater than the axial length of the semiconductor component 1, 2, 3, so that in each of these embodiments semiconductor component is electrically insulated from the under and over housing members, since each of said under and over housing members abuts said elastic jacket rather than the electrode members of said semiconductor component.

In the embodiment of FIG. 5, each of the under and over housing members 52 and 62 is of substantially planar plate configuration. The under and over housing members 52 and 62 are spaced from each other and form the gap between them. The thixotropic fusible synthetic material of the intermediate portion 7 is provided between the under and over housing members 52 and 62 in their areas beyond their central base areas 52*a* and 62*a*, respectively.

Depressions may be formed in the inside surfaces of the under and over housing members 52 and 62 to axially center the semiconductor component 1, 2, 3, 4. Protrusions or extensions 8 are preferably formed in the inside surfaces of the under and over housing members 52 and 62, however, to axially center the semiconductor component 1, 2, 3, 4. The protrusions or extensions 8 also serve to maintain the intermediate portion 7 radially spaced from the semiconductor component 1, 2, 3, 4 and in coaxial position with said semiconductor component.

In the embodiment of FIG. 6, each of the under and over housing members 53 and 63, respectively, is the same as the other and as the under housing member 51 of the embodiment of FIG. 3. Each of the under and over housing members 53 and 63 is of substantially cylindrical configuration. The under housing member 53 has a closed base 53*a* under the semiconductor component 1, 2, 3, 4 and an open base around the semiconductor component. The over housing member 63 has a closed base 63*a* over the semiconductor component 1, 2, 3, 4 and open base around said semiconductor component.

Each of the under and over housing members 53 and 63, respectively, has the same diameter and altitude and the open base of each is spaced from the open base of the other. The semiconductor component 1, 2, 3, 4 protrudes from the open base of each of the under and over housing members 53 and 63. The closed bases 53*a* and 63*a* of the under and over housing members are axially spaced from each other and form the gap between them. The thixotropic fusible synthetic material of the intermediate portion 7, which is initially annular in shape, is provided between the closed bases 63*a* and 53*a* and fills the space between them.

The intermediate portion material 7 is supported on the closed base 53*a* of the under housing member 53 and extends within said under housing member and fills the annular space formed between the semiconductor component 1, 2, 3, 4 and the cylindrical sides 53*b* and 63*b* of said under housing member and the over housing member 63. The cylindrical sides 53*b* and 63*b* of the under and over housing members 53 and 63, respectively, provide a larger adhering or contact surface between the thixotropic fusible synthetic material of the intermediate portion 7 and said under and over housing members. The intermediate portion 7 and the cylindrical sides 53*b* and 63*b* of the under and over housing members 53 and 63, respectively, serve to axially center the semiconductor component 1, 2, 3, 4.

Figure 7:
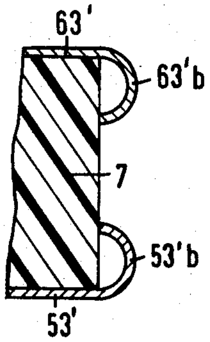
FIG. 7 is a sectional view of part of a modification of the embodiment of FIG. 6, prior to heating.

In the modification of FIG. 7, the sides 53'*b* and 63'*b* of the under and over housing members 53' and 63', respectively, are curved outwardly in the manner of ribs or half toroids. The modification of FIG. 7 is otherwise identical with the embodiment of FIG. 6.

In each of the embodiments of FIGS. 1, 3, 4, 5 and 6, as well as the modification of FIG. 6, the semiconductor component is first placed on the under housing member in an evacuated or gas or air filled chamber which is gas-tight. The over housing member is then placed over the semiconductor component in the chamber in spaced relation with the under housing member to form a gap therebetween. The intermediate portion of thixotropic fusible synthetic material is placed closely adjacent the gap, either before or after the over housing member is placed over the semiconductor component. The semiconductor device is then heated to the melting point of the thixotropic material. The thixotropic material melts and flows in the aforedescribed manner to seal the semiconductor device in a gas-tight manner by filling and sealing the gap in a gas-tight manner. The temperature in the chamber is then decreased to permit the thixotropic material to harden. The semiconductor device is then removed from the chamber.

While the invention has been described by means of specific examples and in specific embodiments, we do not wish to be limited thereto, for obvious modifications will occur to those skilled in the art without departing from the spirit and scope of the invention.

We claim:

1. A gas-tight sealed semiconductor device, comprising:
a semiconductor component; and
a housing enclosing said semiconductor component, said housing comprising an under housing member supporting said semiconductor component, an over housing member covering said semiconductor component, said under and over housing members being in spaced relation in a manner whereby they form a gap between them, and an intermediate portion filling said gap in a gas-tight manner, said intermediate portion comprising hardenable fusible synthetic material having thixotropic properties in a molten state.

2. A semiconductor device as claimed in claim 1, wherein each of said under and over housing members comprises metal.

3. A semiconductor device as claimed in claim 1, wherein each of said under and over housing members comprises thin pliable sheets of tin-plated copper.

4. A semiconductor device as claimed in claim 1, wherein said intermediate portion material is electrically insulative.

5. A semiconductor device as claimed in claim 1, further comprising an elastic jacket of electrically insulating material around said semiconductor component and transverse to said under and over housing members.

6. A semiconductor device as claimed in claim 1, wherein said under housing member has a configuration of a substantially shallow pan having a closed base under said semiconductor component and an open base around said semiconductor component and said semiconductor protrudes from the open base of said under housing member.

7. A semiconductor device as claimed in claim 1, wherein each of said under and over housing members has a substantially cylindrical configuration, said under housing member having a closed base under said semiconductor component and an open base around said semiconductor component and said over housing member having a closed base over said semiconductor component and an open base around said semiconductor component, said gap being formed between said under and over housing members in the area of the open bases thereof.

8. A semiconductor device as claimed in claim 1, wherein each of said under and over housing members is of substantially planar plate configuration and said under and over housing members are spaced from each other and forming said gap between them, and said intermediate portion material is provided between said under and over housing members and fills the space between them.

9. A semiconductor device as claimed in claim 6, wherein said over housing member has a substantially cylindrical configuration having a closed base over said semiconductor component and an open base around said semiconductor component and extending within the open base of said under housing member, said gap being formed between said under and over housing members in the area of the open bases thereof.

10. A semiconductor device as claimed in claim 7, wherein said under housing member has a large diameter and a small altitude relative to said over housing member and said over housing member has a small diameter and a large altitude relative to said under housing member, the open base of said over housing member extending within the open base of said under housing member and said intermediate portion material being supported on the closed base of said under housing member within said under housing member and extending within said gap.

11. A semiconductor device as claimed in claim 9, wherein said under housing member further comprises an annular flange extending around the open base thereof and said intermediate portion material is supported on said annular flange and extends within said gap.

References Cited

UNITED STATES PATENTS

| | | | |
|---|---|---|---|
| 2,636,062 | 4/1953 | Colton | 317—235 |
| 2,817,048 | 12/1957 | Thuermel et al. | 317—234 |
| 3,085,180 | 4/1963 | Zwijsen | 317—234 |
| 3,221,277 | 11/1965 | Hauer | 317—234 |
| 3,223,903 | 12/1965 | Solomon | 317—234 |
| 3,231,795 | 1/1966 | Steinhelper | 317—234 |
| 3,241,010 | 3/1966 | Eddleston | 317—234 |
| 3,299,328 | 1/1967 | Martin et al. | 317—234 |
| 3,310,716 | 3/1967 | Emeis | 317—234 |
| 3,328,650 | 6/1967 | Boxer | 317—234 |
| 3,337,678 | 8/1967 | Steimak | 317—234 |

FOREIGN PATENTS

| | | |
|---|---|---|
| 926,423 | 5/1963 | Great Britain. |

OTHER REFERENCES

IBM Technical Disclosure Bulletin, "Semiconductor Housing," by Michelitsch, vol. 6, No. 6, November 1963, p. 71.

JOHN W. HUCKERT, Primary Examiner

A. J. JAMES, Assistant Examiner

U.S. Cl. X.R.

174—50.51; 220—2.3